United States Patent
Kim et al.

(10) Patent No.: US 12,159,011 B2
(45) Date of Patent: Dec. 3, 2024

(54) DISPLAY DEVICE AND MANUFACTURING METHOD THEREOF

(71) Applicant: Samsung Display Co., Ltd., Yongin-Si (KR)

(72) Inventors: Yoon Ho Kim, Asan-si (KR); June Hwan Kim, Daejeon (KR); Jong Woo Park, Seongnam-si (KR); Chaekyung Jung, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/104,314

(22) Filed: Feb. 1, 2023

(65) Prior Publication Data

US 2023/0259239 A1    Aug. 17, 2023

(30) Foreign Application Priority Data

Feb. 14, 2022   (KR) .................... 10-2022-0019187

(51) Int. Cl.
  *G06F 3/044*   (2006.01)
  *G06F 3/041*   (2006.01)
(52) U.S. Cl.
  CPC .......... *G06F 3/0445* (2019.05); *G06F 3/0412* (2013.01); *G06F 2203/04103* (2013.01)
(58) Field of Classification Search
  CPC ................. G06F 3/0412; G06F 3/0445; G06F 2203/04103
  USPC .................................................. 345/173–174
  See application file for complete search history.

(56) References Cited

U.S. PATENT DOCUMENTS

| 10,692,439 | B2* | 6/2020 | Kim | G09G 3/3266 |
| 2021/0202685 | A1* | 7/2021 | Ban | H10K 50/844 |
| 2021/0313411 | A1 | 10/2021 | Jung et al. | |
| 2021/0328107 | A1 | 10/2021 | An et al. | |
| 2022/0115542 | A1* | 4/2022 | Yang | H01L 27/127 |

FOREIGN PATENT DOCUMENTS

| KR | 10-2019-0046420 A | 5/2019 |
| KR | 10-2021-0093808 A | 7/2021 |
| KR | 10-2021-0124555 A | 10/2021 |

* cited by examiner

*Primary Examiner* — Calvin C Ma
(74) *Attorney, Agent, or Firm* — Innovation Counsel LLP

(57) ABSTRACT

Provided is a display device comprising a display area including a plurality of pixels and a pad area disposed outside the display area, wherein the pad area includes a plurality of pads, and anchor structures positioned between two adjacent pads among the plurality of pads, the pad area includes a substrate, and at least one insulation layer that is positioned on the substrate and includes a first opening positioned between the two adjacent pads when viewed on the cross-section, and the anchor structure includes a first insulation layer that is positioned in the first opening, and does not overlap the pad.

18 Claims, 17 Drawing Sheets

DISPLAY DEVICE AND MANUFACTURING METHOD THEREOF

CROSS-REFERENCE TO RELATED APPLICATION

This application claims priority to and the benefit of Korean Patent Application No. 10-2022-0019187 filed in the Korean Intellectual Property Office on Feb. 14, 2022, the entire contents of which are incorporated herein by reference.

BACKGROUND

(a) Technical Field

The present disclosure generally relates to a display device and a manufacturing method thereof. More particularly, the present disclosure relates to a display device capable of preventing peeling between the stacked layers around the pad of the display panel and a manufacturing method thereof.

(b) Description of the Related Art

A display device such as a liquid crystal display (LCD), an organic light emitting diode (OLED) display, and the like includes a plurality of pixels that can display an image, and a display panel including a plurality of signal lines. Each pixel includes a pixel electrode that receives a data signal, and the pixel electrode may be applied with the data signal by being connected to at least one transistor.

The display panel may include a display area, which is a region capable of displaying an image, and a peripheral area around the display area. In the peripheral area, a pad area in which a plurality of pads to which a printed circuit film, a driving chip, and the like may be attached may be positioned.

The above information disclosed in this Background section is only for enhancement of understanding of the background of the disclosure, and therefore it may contain information that does not form the prior art that is already known in this country to a person of ordinary skill in the art.

SUMMARY

Embodiments are provided to prevent peeling between the stacked layers around the pad of the display panel.

A display device according to an embodiment includes a display area including a plurality of pixels and a pad area disposed outside the display area, wherein the pad area includes a plurality of pads, and anchor structures positioned between two adjacent pads among the plurality of pads, the pad area further includes a substrate and at least one insulation layer that is positioned on the substrate and a first opening positioned between the two adjacent pads is formed in the at least one insulation layer, when viewed on the cross-section, and the anchor structure includes a first insulation layer positioned in the first opening and does not overlap the pad.

The display device may further include a pattern positioned between the anchor structure and the substrate does not overlap the pad.

The first opening may be formed up to a top of the pattern, and a width of the first opening may be smaller than a width of the pattern.

The pattern may include a semiconductor layer positioned between the at least one insulation layer and the substrate.

The pattern may include a conductive layer positioned between the at least one insulation layer and the substrate.

The display device may further include a second insulation layer that is positioned between the at least one insulation layer and the first insulation layer, wherein a surface of the first insulation layer except an upper surface may be in contact with the second insulation layer.

The second insulation layer may form a hole corresponding to the first opening, and the first insulation layer may be positioned in the hole.

The second insulation layer may further include a portion overlapping the pad.

The second insulation layer may further include a portion contacting the pattern.

The display device further includes a third insulation layer that is positioned between the at least one insulation layer and the second insulation layer, wherein the third insulation layer may include an upper portion that contacts a side surface of a first conductive layer included in the pad.

The upper portion of the third insulation layer may include a protrusion portion that protrudes toward the inside of the first opening from an end of the uppermost surface of the at least one insulation layer.

At least a portion of the side surface of the at least one insulation layer may form an inclined surface with respect to a top surface of the substrate in the first opening.

The pad may further include a second conductive layer overlapping the first conductive layer, and the at least one insulation layer may further include a second opening positioned on the second conductive layer.

The first insulation layer may include a first portion of which a width gradually decreases coming closer to the substrate.

The first insulation layer may further include a second portion that is positioned on the first portion and of which a width gradually becomes smaller coming closer to the substrate.

A display device according to an embodiment includes: a substrate; a plurality of pads including a first conductive layer positioned on the substrate; a plurality of insulation layers that are positioned between the substrate and the first conductive layer; and an anchor structure that is positioned between two adjacent pads among the plurality of pads, wherein a first opening that is positioned between the two adjacent pads is formed in the plurality of insulation layers, and the anchor structure includes a first insulation layer positioned in the first opening.

The display device may further include a pattern positioned between the anchor structure and the substrate does not overlap the pad.

A width of the first insulation layer may decrease coming closer to the substrate.

A manufacturing method of a display device according to an embodiment includes steps of: forming a pattern on a substrate; forming a plurality of insulation layers, a first opening of which a width is smaller than the width of the pattern on the pattern is formed in the plurality of insulation layers; forming a first conductive layer of a pad on the plurality of insulation layers; forming an insulation pattern that includes a portion positioned in the first opening and covers a side surface of the first conductive layer; forming a protection pattern, a second opening corresponding to the first opening on the insulation pattern is formed in the protection pattern; forming a first insulation layer, a third opening corresponding to the first opening by etching the insulation pattern using the protection pattern as an etching mask is formed in the first insulation layer; and forming a second insulation layer positioned in the third opening, wherein the second insulation layer does not overlap the pad.

The first insulation layer may include a protrusion portion protruded inward of the first opening from an end portion of an uppermost surface of the plurality of insulation layers.

According to the embodiments, it is possible to prevent peeling between the stacked layers around the pad of the display panel.

DETAILED DESCRIPTION OF THE EMBODIMENTS

Figure 1:
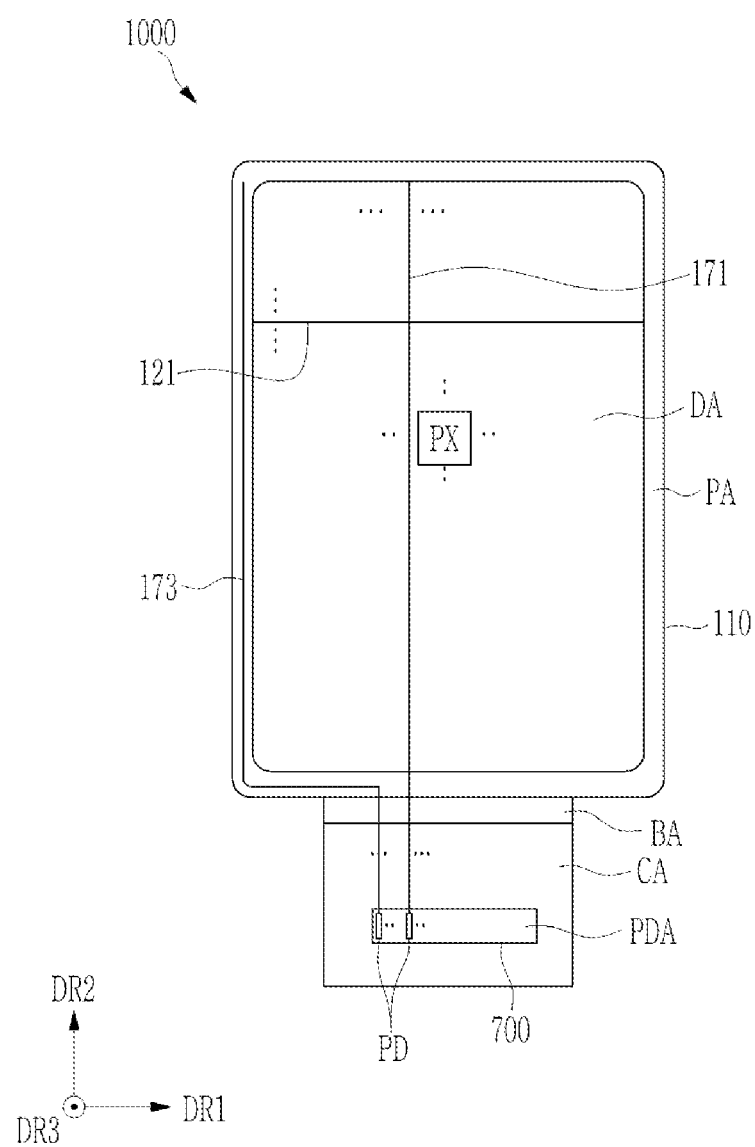
FIG. 1 is a top plan view of a display panel included in a display device according to an embodiment.

Hereinafter, with reference to the accompanying drawings, various embodiments of the present disclosure will be described in detail such that those of ordinary skill in the art can easily carry out the present disclosure. As those skilled in the art would realize, the described embodiments may be modified in various different ways.

The drawings and description are to be regarded as illustrative in nature and not restrictive. Like reference numerals designate like elements throughout the specification.

In addition, since the size and thickness of each component shown in the drawing are arbitrarily indicated for better understanding and ease of description, the present disclosure is not necessarily limited thereto. In the drawings, the thickness of layers, films, panels, regions, etc., are exaggerated for clarity. In addition, in the drawing, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Figure 2:
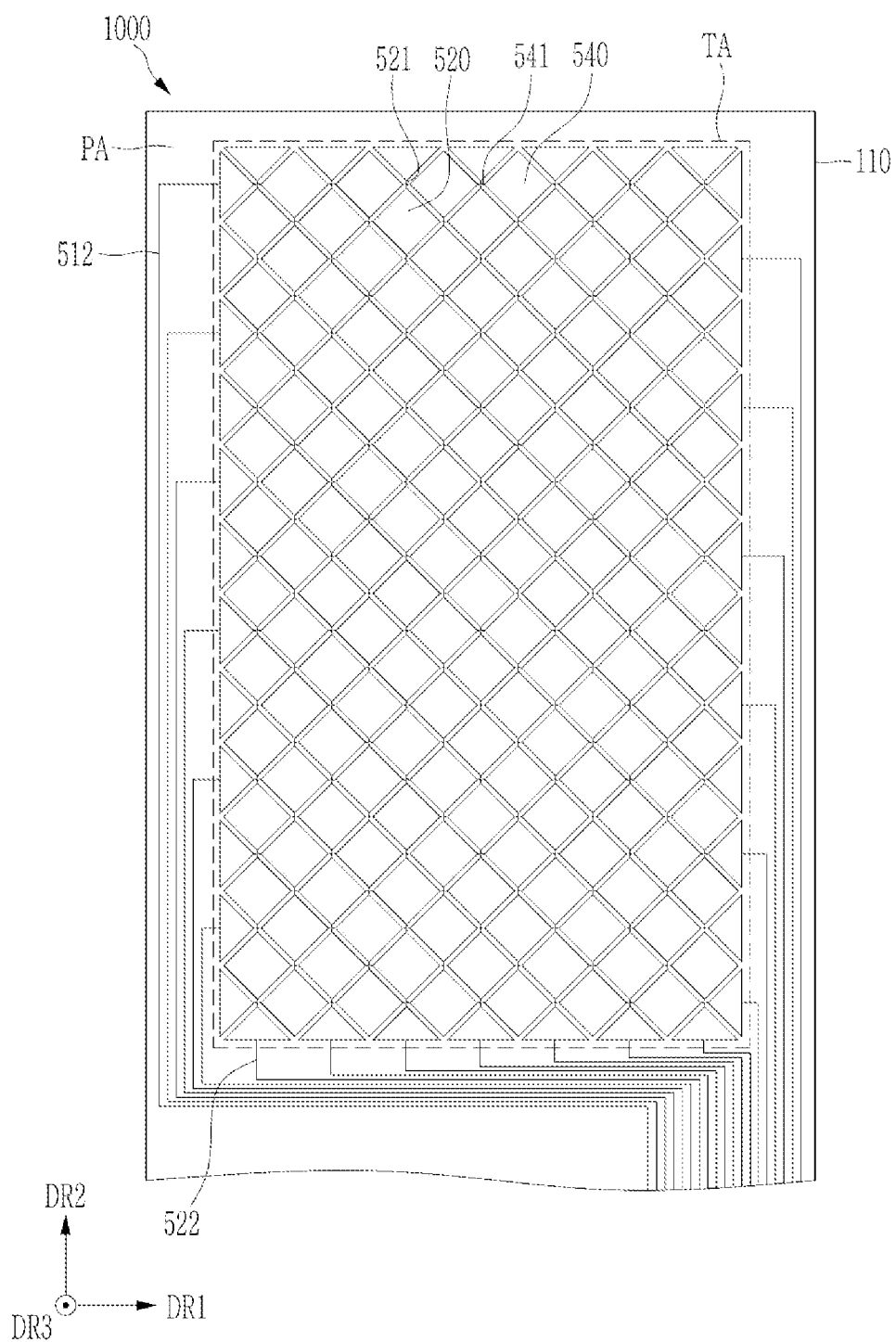
FIG. 2 is a top plan view of a detection portion of the display device according to the embodiment.

Referring to FIG. 1 and FIG. 2, a display device according to an embodiment will be described.

FIG. 1 is a top plan view of a display panel included in a display device according to an embodiment, and FIG. 2 is a top plan view of a detection portion of the display device according to the embodiment.

Referring to FIG. 1, a display device according to an embodiment includes a display panel 1000 that includes a display area DA where an image can be displayed, and a non-display area which is an area excluding the display area DA. The display panel 1000 includes a substrate 110.

The display area DA may display an image on a plane parallel to a first direction DR1 and a second direction DR2. The display area DA includes a plurality of pixels PX, which are units for displaying an image, and a plurality of signal lines.

The pixel PX may include at least one transistor formed on the substrate 110 and a pixel electrode connected thereto. For example, when the pixel PX includes at least one light emitting element, each pixel PX may include at least one transistor connected to the light emitting element. In order to implement color display, each pixel PX may display one of specific colors, and an image of a desired color may be recognized as combinations of images displayed by these specific colors.

The signal lines include a plurality of scan lines 121 transmitting a scan signal and a plurality of data lines 171 transmitting a data signal. Each scan line 121 mainly extends from the display area DA in the first direction DR1, and the data line 171 extends mainly from the display area DA in the second direction DR2 and may be connected to a driver 700 positioned in the non-display area.

The non-display area may include a peripheral area PA and a circuit area CA positioned around the display area DA.

The peripheral area PA may be a region adjacent to the display area DA and surrounding the display area DA. At least one signal line 173 may be positioned in the peripheral area PA. The signal line 173 may extend along the edge of the display area DA and extend to the circuit area CA.

The circuit area CA may be positioned below a lower edge of the display area DA. The circuit area CA may include a pad area PDA including a plurality of pads PD, and a circuit including at least one transistor.

A driver 700 is mounted on the pad area PDA and is electrically connected to the pad PD. The driver 700 is connected to the display panel 1000 and may apply various driving signals and driving voltages to the display panel 1000. The driver 700 may be in the form of a flexible printed circuit film, flexible printed circuit board (FPB), or at least one driving circuit chip. In FIG. 1, the driver 700 is provided in the form of a driving circuit chip, as an example.

The plurality of data lines 171 may be connected to the driver 700 and may receive a data signal.

The display panel 1000 included in the display device according to an embodiment may further include a bending area BA. The bending area BA may be positioned between the circuit area CA and the display area DA, and may extend across the substrate 110 in the first direction DR1. The display panel 1000 is bent in the bending area BA and thus the circuit area CA positioned outside the bending area BA can be folded behind the display area DA of the display panel 1000. FIG. 1 shows a state in which the display panel 1000 is unfolded without being bent in the bending area BA.

The bending area BA may be omitted depending on a structure of the display device.

Referring to FIG. 2, the display panel 1000 may further include a touch area TA in which a plurality of sensing electrodes 520 and 540 are formed on the display area DA. A region around the touch area TA may correspond to the peripheral area PA described above. Depending on embodiments, the touch area TA may include the display area of FIG. 1, or may be an area that further includes a part of the peripheral area PA.

A plurality of sensing electrodes 520 and 540 may include a plurality of first sensing electrodes 520 and a plurality of second sensing electrodes 540. In the touch area TA, the first sensing electrode 520 and the second sensing electrode 540 are electrically isolated from each other. Depending on embodiments, the first sensing electrode 520 may be an input electrode to which a sensing input signal is applied, and the second sensing electrode 540 may be an output electrode for outputting a sensing output signal, or vice versa.

The plurality of first sensing electrodes 520 and the plurality of second sensing electrodes 540 may be alternately dispersed so as to not overlap each other in the touch area TA. The first sensing electrode 520 and the second sensing electrode 540 are positioned on the same layer on the substrate 110, but may be positioned on different layers. The first sensing electrode 520 and the second sensing electrode 540 may be formed of a transparent conductor or an opaque conductor, and a plurality of openings may be formed in each of the sensing electrodes 520 and 540.

The plurality of first sensing electrodes 520 are electrically connected to each other by first connection portions 521, and the plurality of second sensing electrodes 540 are electrically connected to each other by second connection portions 541. When the plurality of first sensing electrodes 520 are connected to each other in one direction, the plurality of second sensing electrodes 540 may be connected to each other in another direction crossing the one direction. When the first sensing electrode 520 and the second sensing electrode 540 are positioned on the same layer on the substrate 110, one of the first connection portions 521 and the second connection portions 541 is positioned on the same layer as the first sensing electrode 520 and the second sensing electrode 540, and the other one is positioned on a different layer from that of the first sensing electrode 520 and the second sensing electrode 540.

A plurality of sensing wires 512 and 522 respectively connected to a plurality of first sensing electrodes 520 and a plurality of second sensing electrodes 540 are positioned in the peripheral area of the touch area TA corresponding to the peripheral area PA. The first sensing wire 512 may be connected to, for example, the plurality of second sensing electrodes 540 arranged in the first direction DR1, and the second sensing wire 522 may be connected to, for example, the plurality of first sensing electrodes 520 arranged in the second direction DR2. Depending on embodiments, the first sensing wire 512 and the second sensing wire 522 may be electrically connected to a part of the pad PD of the pad area PDA in FIG. 1.

In FIG. 2, a detector of a mutual-cap type for sensing touch using two sensing electrodes 520 and 540 is illustrated. However, depending on embodiments, it may be formed as a self-cap type of detector that detects a touch using only one sensing electrode.

Figure 3:
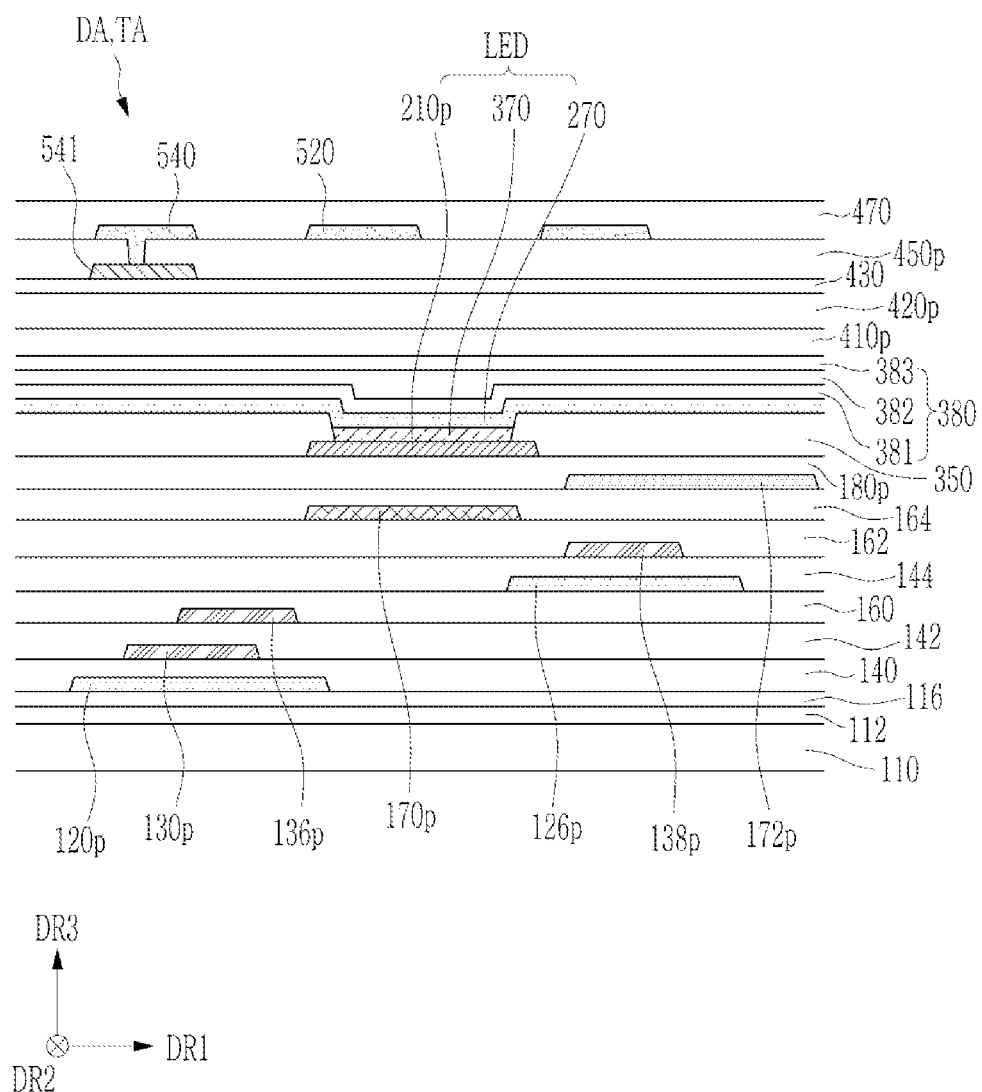
FIG. 3 is a cross-sectional view of the display device.

Referring to FIG. 3 together with FIG. 1 and FIG. 2, a cross-sectional structure of the display device according to the embodiment will be described.

FIG. 3 is a cross-sectional view of the display area DA and the touch area TA according to the embodiment.

Referring to FIG. 3, the display device according to the embodiment includes the substrate 110, and a barrier layer 112, a buffer layer 116, a first semiconductor layer 120p, a first insulation layer 140, a first conductive layer 130p, a second insulation layer 142, a second conductive layer 136p, a third insulation layer 160, a second semiconductor layer 126p, a fourth insulation layer 144, a third conductive layer 138p, a fifth insulation layer 162, a fourth conductive layer 170p, a sixth insulation layer 164, a fifth conductive layer 172p, a seventh insulation layer 180p, a pixel electrode 210p, an eighth insulation layer 350, an emission layer 370, a common electrode 270, an encapsulation layer 380, a ninth insulation layer 410p, a tenth insulation layer 420p, an eleventh insulation layer 430, a second connection portion 541 of a first sensing conductive layer, a twelfth insulation layer 450p, a second sensing electrode 540 of a second sensing conductive layer, a first sensing electrode 520, and a thirteenth insulation layer 470 may be sequentially positioned on the substrate 110 in a third direction DR3.

The substrate 110 may include a material that does not bend due to a rigid characteristic such as glass, or a flexible material that can be bent, such as plastic or polyimide.

The barrier layer 112 and the buffer layer 116 may include an inorganic insulating material such as a silicon oxide ($SiO_x$), a silicon nitride ($SiN_x$), a silicon oxynitride ($Si O_x N_y$), and the like, or an organic insulating material. At least one of the barrier layer 112 and the buffer layer 116 may be omitted.

The first semiconductor layer 120p may include an oxide semiconductor, amorphous silicon, polysilicon, or the like.

The first conductive layer 130p may include a first gate electrode overlapping a channel region of the first semiconductor layer 120p. The first gate electrode and the first semiconductor layer 120p may form a first transistor. The first conductive layer 130p may include a metal such as copper (Cu), molybdenum (Mo), aluminum (Al), silver (Ag), chromium (Cr), tantalum (Ta), titanium (Ti), and the like, or a metal alloy thereof, and may be formed of a single layer or multiple layers.

The second conductive layer 136p may overlap at least a part of the first conductive layer 130p to form a capacitor. The second conductive layer 136p may receive a driving voltage.

The second semiconductor layer 126p may include an oxide semiconductor, amorphous silicon, polysilicon, and the like. Depending on embodiments, a semiconductor material of the second semiconductor layer 126p and a semiconductor material of the first semiconductor layer 120p may be different from each other. For example, the first semiconductor layer 120p may include polysilicon, and the second semiconductor layer 126p may include an oxide semiconductor.

The third conductive layer 138p may include a second gate electrode overlapping a channel region of the second semiconductor layer 126p. The second gate electrode and the second semiconductor layer 126p may form a second transistor. The third conductive layer 138p may include a metal such as copper (Cu), molybdenum (Mo), aluminum (Al), silver (Ag), chromium (Cr), tantalum (Ta), titanium (Ti), and the like, or a metal alloy thereof, and may be formed of a single layer or multiple layers.

The fourth conductive layer 170p may include a plurality of connection electrodes. For example, the fourth conductive layer 170p may include a connection electrode electrically connecting a conductive region of the first semiconductor layer 120p and a conductive region of the second semiconductor layer 126p. The fourth conductive layer 170p may be formed of a single layer or multiple layers, and may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu). For example, the fourth conductive layer 170p may be formed of a triple layer such as Ti/Al/Ti.

At least one of the first insulation layer 140, the second insulation layer 142, the third insulation layer 160, the fourth insulation layer 144, and the fifth insulation layer 162 may include an inorganic insulating material including a silicon oxide ($SiO_x$), a silicon nitride ($SiNO_x$ a silicon oxynitride ($SiO_xN_y$), and the like, or an organic insulating material.

The fifth conductive layer 172p may include a data line or a driving voltage line. The fifth conductive layer 172p may be formed of a single layer or multiple layers, may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu). For example, the fifth conductive layer 172p may be formed of a triple layer such as Ti/Al/Ti.

At least one of the sixth insulation layer 164 and the seventh insulation layer 180p may include an organic insulation material such as a general-purpose polymer such as polymethylmethacrylate (PMMA) or polystyrene (PS), polymer derivatives with phenolic groups, acryl-based polymers, imide-based polymers, polyimides, acryl-based polymers, siloxane-based polymers, and the like.

The pixel electrode 210p may include at least one of a transparent conductive material such as an indium tin oxide (ITO), a poly-ITO, an indium zinc oxide (IZO), an indium gallium zinc oxide (IGZO), and an indium tin zinc oxide (ITZO), and/or a metallic material such as silver (Ag), molybdenum (Mo), copper (Cu), gold (Au), and aluminum (Al).

The eighth insulation layer 350 may include an organic insulating material such as polyimide, polyamide, acryl resin, benzocyclobutene, and phenol resin.

The common electrode 270 may include a transparent conductive material such as an ITO, an IZO, an IGZO, and an ITZO. The common electrode 270 may have a translucent characteristic.

The pixel electrode 210p and the common electrode 270 form a light emitting diode LED together with the emission layer 370 therebetween.

The encapsulation layer 380 may include at least one inorganic layer and at least one organic layer. For example, as shown in FIG. 3, the encapsulation layer 380 may include a first inorganic encapsulation layer 381, an organic encapsulation layer 382, and a second inorganic encapsulation layer 383 that are sequentially stacked in the third direction DR3.

At least one of the ninth insulation layer 410p, the eleventh insulation layer 430, and the twelfth insulation layer 450p may include an inorganic insulating material such as a silicon oxide ($SiO_x$), a silicon nitride ($SiN_x$), and a silicon oxynitride ($SiO_xN_y$), or an organic insulating material such as an acryl-based resin, a krill-based resin, polyisoprene, a vinyl-based resin, an epoxy-based resin, a urethane-based resin, a cellulose-based resin, and a perylene-based resin.

The tenth insulation layer 420p is a layer for planarization, and may include an organic insulating material such as an acryl-based resin, a methacrylic resin, polyisoprene, a vinyl-based resin, an epoxy-based resin, a urethane-based resin, a cellulose-based resin, and a perylene-based resin. The tenth insulation layer 420p may be formed only in a part of the display area DA or the touch area TA.

At least one of the first sensing conductive layer and the second sensing conductive layer may be formed of a single layer or multilayers, and may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu). For example, the first sensing conductive layer may be formed of a triple layer such as Ti/Al/Ti.

As shown in FIG. 3, the first sensing electrode 520, the second sensing electrode 540, and the above-described first connection portion 521 are positioned in the first sensing conductive layer, and the second connection portion 541 may be positioned in the second sensing conductive layer. In addition, the above-described first connection portion 521 may be positioned in the first sensing conductive layer, which is different layer from that of the first sensing electrode 520 and the second sensing electrode 540, and the second connection portion 541 may be positioned in the same layer as the first sensing electrode 520 and the second sensing electrode 540. In addition, the first sensing electrode 520, the second sensing electrode 540, and the second connection portion 541 may be positioned in the first sensing conductive layer, and the first connection portion 521 may be positioned in the second sensing conductive layer.

The thirteenth insulation layer 470 is a layer for protecting the first sensing conductive layer and the second sensing conductive layer, and may include an organic insulating material.

Figure 4:
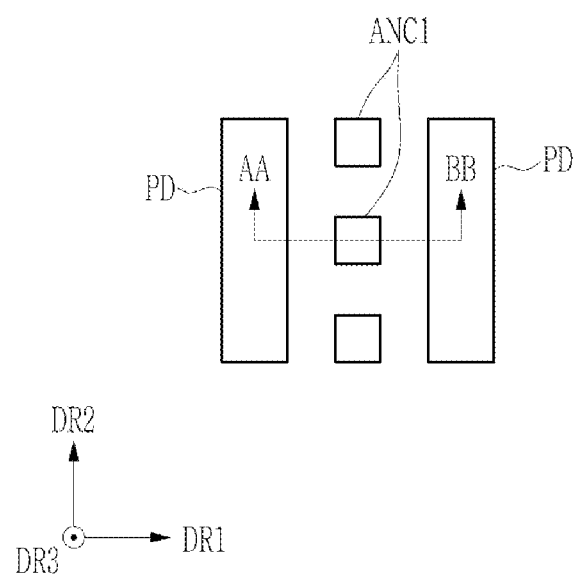
FIG. 4 is a top plan view of a part of a pad area of a display device according to an embodiment.
Figure 5:
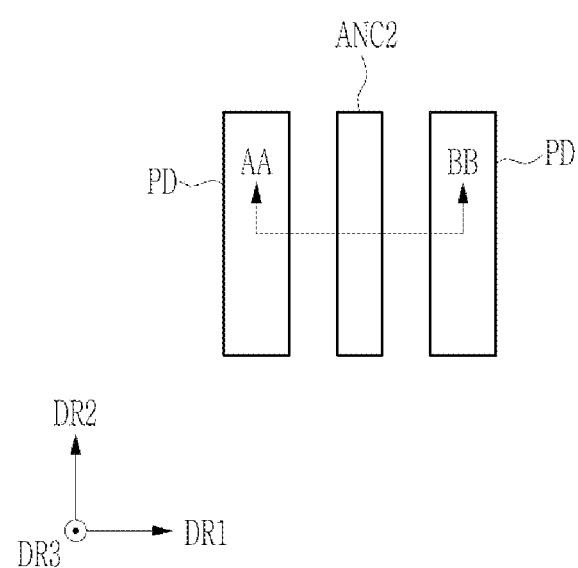
FIG. 5 is a top plan view of a part of a pad area of a display device according to an embodiment.
Figure 6:
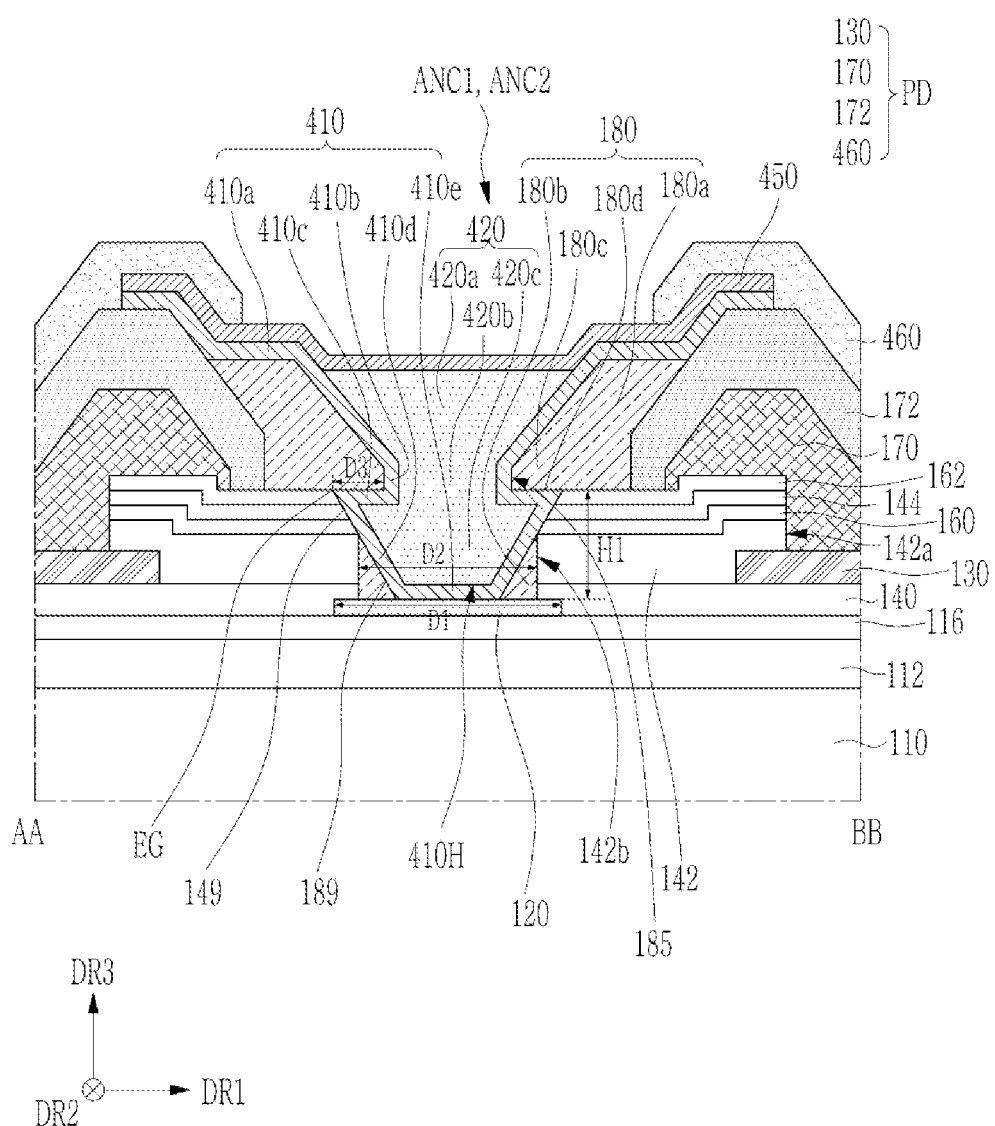
FIG. 6 is a cross-sectional view of the display device of FIG. 4 or FIG. 5, taken along the line AA-BB.

Referring to FIGS. 4, 5, and 6, together with the above-described FIGS. 1, 2, and 3, the pad area PDA of the display panel will be described.

FIG. 4 and FIG. 5 are top plan views of the pad area of the display device according to embodiments.

Referring to FIG. 1, FIG. 4, and FIG. 5, at least one of anchor structures ANC1 and ANC2 positioned between adjacent pad PDs is positioned in the pad area PDA of the display panel 1000. The anchor structures ANC1 and ACN2 may be positioned between all adjacent pad PDs, or may be positioned only between some adjacent pad PDs.

As shown in FIG. 4, a plurality of anchor structures ANC1 may be positioned between neighboring pads PD. When two pad PDs are arranged in the first direction DR1, a plurality of anchor structures ANC1 may be arranged approximately in the second direction DR2.

As shown in FIG. 5, one anchor structure ANC2 may be positioned between neighboring pads. When two pads PD are arranged in the first direction DR1, the anchor structure ANC2 may also be arranged adjacent to the two pads PD in the first direction DR1 and the anchor structure ANC2 may extend long approximately in the second direction DR2.

The adjacent pads PD and the anchor structures ANC1 and ANC2 are spaced apart from each other.

Next, a cross-sectional structure of the anchor structures ANC1 and ANC2 between the two pads PD will be described with reference to FIG. 6 together with the above-described FIGS. 1, 2, 3, 4, and 5. The same description of the constituent elements and the same constituent elements described above will be omitted below.

FIG. 6 is a cross-sectional view of the display device of FIG. 4 or FIG. 5, taken along the line AA-BB.

Referring to FIG. 6, a barrier layer 112 and a buffer layer 116 may be sequentially positioned on the substrate 110 of the display panel, and the first semiconductor layer 120 may be positioned thereon. The first semiconductor layer 120 is positioned between two adjacent pad PDs, and may be patterned and formed in regions corresponding to the anchor structures ANC1 and ANC2. The first semiconductor layer 120 is positioned on the same layer as the first semiconductor layer 120p of the display area DA, and may include the same material and may be formed together in the same process. The first semiconductor layer 120 is also called a pattern.

The first insulation layer 140 may be positioned on the first semiconductor layer 120, and the first conductive layer 130 may be positioned on the first insulation layer 140. The first conductive layer 130 may be patterned and formed in a region corresponding to the pad PD, and may be removed from the regions of the anchor structures ANC1 and ANC2. The first conductive layer 130 is positioned on the same layer as the first conductive layer 130p of the display area DA, and may include the same material and may be formed together in the same process.

At least one insulation layer may be positioned on the first conductive layer 130. FIG. 6 illustrates an example in which at least one insulation layer on the first conductive layer 130 includes a second insulation layer 142, a third insulation layer 160, a fourth insulation layer 144, and a fifth insulation layer 162 that are sequentially stacked from below.

At least one insulation layer, which may include the second insulation layer 142, the third insulation layer 160, the fourth insulation layer 144, and the fifth insulation layer 162, is patterned and includes a first opening 142a positioned on the first conductive layer 130, and a second opening 142b that is patterned with the first insulation layer 140 and positioned on the first semiconductor layer 120. The second opening 142b may be formed only up to an upper surface of the first semiconductor layer 120. That is, the second opening 142b may expose the upper surface of the first semiconductor layer 120. The second opening 142b is positioned between the two adjacent pads PD on the plane.

A width D2 in one direction of the second opening 142b may be smaller than a width D1 in the same direction as the first semiconductor layer 120. For example, when the width D1 of the first semiconductor layer 120 is about 10 micrometers, the width D2 of the second opening 142b may be about 7 micrometers, but is not limited thereto.

An upper portion of the second opening 142b may form an inclined surface 149 that is oblique to the upper surface of the substrate 110. The inclined surface 149 may be formed on a side of at least one insulation layer positioned above among the first insulation layer 140, the second insulation layer 142, the third insulation layer 160, the fourth insulation layer 144, and the fifth insulation layer 162. FIG. 6 shows an example in which the inclined surface 149 is formed on the side surface of the third insulation layer 160, the fourth insulation layer 144, and the fifth insulation layer 162 which are positioned sequentially from the top. Depending on embodiments, the inclined surface 149 may be formed only on the side surface of the uppermost fifth insulation layer 162 among the second insulation layer 142, the third insulation layer 160, the fourth insulation layer 144, and the fifth insulation layer 162, may be formed only on the side surface of the fourth insulation layer 144 and the fifth insulation layer 162, and may be formed on the side surfaces of the second insulation layer 142, the third insulation layer 160, the fourth insulation layer 144, and the fifth insulation layer 162.

Depending on embodiments, the inclined surface 149 may be omitted. In this case, a side surface of the second opening 142b may be generally perpendicular to the top surface of the substrate 110, but is not limited thereto.

A height of the first insulation layer 140 forming the second opening 142b on the first semiconductor layer 120 and a height of at least one insulation layer thereon in the third direction DR3, or a depth H1 of the second opening 142b, may be approximately 13,000 angstroms to 14,000 angstroms, but is not limited thereto.

A fourth conductive layer 170 may be positioned on the fifth insulation layer 162. The fourth conductive layer 170 may be patterned and formed in the region corresponding to the pad PD, and may be removed from the regions of the anchor structures ANC1 and ANC2. The fourth conductive layer 170 may contact and be electrically connected to the first conductive layer 130 through the first opening 142a. The fourth conductive layer 170 is positioned on the same layer as the fourth conductive layer 170p of the display area DA, and may include the same material and may be formed together in the same process.

A fifth conductive layer 172 may be positioned on the fourth conductive layer 170. The fifth conductive layer 172 may be patterned and formed in the region corresponding to the pad PD, and may be removed from the regions of the anchor structures ANC1 and ANC2. The fifth conductive layer 172 may be positioned on the fourth conductive layer 170, and may contact and be electrically connected to the fourth conductive layer 170. The fifth conductive layer 172 is positioned on the same layer as the fifth conductive layer 172p of the display area DA, and may include the same material and may be formed together in the same process.

Depending on embodiments, one conductive layer among the fourth conductive layer 170 and the fifth conductive layer 172 positioned on the pad PD may be omitted.

A seventh insulation layer 180 may be positioned on the fifth conductive layer 172. A third opening 185 corresponding to the first semiconductor layer 120, or the second opening 142b of the at least one insulation layer positioned between the first conductive layer 130 and the fourth conductive layer 170 may be defined in the seventh insulation layer 180.

The seventh insulation layer 180 includes an upper portion 180a positioned above the uppermost surface of the at least one insulation layer (e.g., the upper surface of the fifth insulation layer 162) positioned between the first conductive layer 130 and the fourth conductive layer 170, and a lower portion 180b positioned below the upper portion 180a. The seventh insulation layer 180 further includes a protrusion portion 180c and a bottom surface 180d.

The upper portion 180a of the seventh insulation layer 180 may overlap at least a part of the fifth conductive layer 172 in a direction that is perpendicular to the top surface of the substrate 110, that is, the third direction DR3, and most of a central portion of the fifth conductive layer 172 may be exposed without overlapping on a plane. In particular, the upper portion 180a may cover and protect a side of the fifth conductive layer 172. Accordingly, it is possible to prevent a metal component of the fifth conductive layer 172 from being deposited with an etching solution when a layer to be laminated is etched in a subsequent process.

The upper portion 180a includes a portion that overlaps the uppermost surface of at least one insulation layer (e.g., the top surface of the fifth insulation layer 162) disposed between the first conductive layer 130 and the fourth conductive layer 170 in a direction that is perpendicular to the top surface of the substrate 110, that is, the third direction DR3, and the protrusion portion 180c that protrudes inward of the second opening 142b from an end portion EG where the uppermost surface of at least one insulation layer disposed between the first conductive layer 130 and the fourth conductive layer 170 (i.e., the top surface of the fifth insulation layer 162 in FIG. 6) and an upper end of the second opening 142 meet each other. A length D3 of the bottom surface 180d of the protrusion portion 180c protruded from the end portion EG is greater than 0, for example, may be approximately 1 micrometer to 2 micrometers, but is not limited thereto.

The lower portion 180b may be in contact with a side surface of the second opening 142b of at least one insulation layer from the bottom among the first insulation layer 140, the second insulation layer 142, the third insulation layer 160, the fourth insulation layer 144, and the fifth insulation layer 162. FIG. 6 illustrates an example in which the lower portion 180b contacts the side surface of the second opening 142b of the first insulation layer 140 and the second insulation layer 142.

The lower portion 180b may contact the upper surface of the first semiconductor layer 120 exposed by the second opening 142b. The other side of the lower 180b, which is not in contact with the side surface of the opening 142b, may form an inclined surface 189 inclined with respect to the upper surface of the substrate 110. The inclined surface 189 may form a continuous surface to the inclined surface 149 formed by an upper portion of the second opening 142b. A slope of the inclined surface 189 to the top of the substrate 110 may be the same as the slope of the inclined surface 149 to the top of the substrate 110, but is not limited thereto.

Depending on embodiments, the lower portion 180b may contact side surfaces of the first insulation layer 140, the second insulation layer 142, the third insulation layer 160, the fourth insulation layer 144, and the fifth insulation layer 162 in the second opening 142b, and in this case, the inclined surface 189 may extend to the same height as the upper surface of the fourth insulation layer 144 or the fifth insulation layer 162.

The seventh insulation layer 180 may overlap a part of an edge of the pad PD in the third direction DR3, and most regions including the central part of the pad PD are not covered.

The cross-sectional shape of the third opening 185 of the seventh insulation layer 180 may have the shape of an anchor. In the cross-sectional view shown in FIG. 6, the width of the third opening 185 at the top in the first direction DR1 is the largest and becomes smaller as it goes downward, and the width increases again at about the same height as the upper surface of the fifth insulation layer 162, and then becomes narrower as it goes down again.

The seventh insulation layer 180 is positioned on the same layer as the seventh insulation layer 180p of the display area DA, and may contain the same material and may be formed together in the same process.

A ninth insulation layer 410 may be positioned over the seventh insulation layer 180 and the fifth conductive layer 172. The ninth insulation layer 410 may include an upper portion 410a, a side portion 410b, a bottom portion 410c, an inclined portion 410d, and a bottom portion 410e.

The upper portion 410a is positioned on the upper surface of the upper portion 180a of the seventh insulation layer 180 and may be in contact with the upper surface of the upper portion 180a. The side portion 410b is positioned next to the side surface of the protruding portion 180c of the upper portion 180a of the seventh insulation layer 180 and may be in contact with the side surface of the protruding portion 180c.

The bottom portion 410c is positioned under the bottom surface 180d of the protruding portion 180c of the upper portion 180a of the seventh insulation layer 180 and may be in contact with the bottom surface 180d.

The inclined portion 410d is positioned on the inclined surface 189 of the lower portion 180b of the seventh insulation layer 180 and may be in contact with the inclined surface 189 of the lower portion 180b of the seventh insulation layer 180. The inclined portion 410d may further include a portion in contact with the inclined surface 149 of the second opening 142b. The inclined portion 410d includes a portion closer to the substrate 110 than the uppermost surface of at least one insulation layer positioned between the first conductive layer 130 and the fourth conductive layer 170 (e.g., the upper surface of the fifth insulation layer 162).

The bottom portion 410e is positioned on the first semiconductor layer 120 not covered with the lower portion 180b of the seventh insulation layer 180 and may be in direct contact with the top surface of the first semiconductor layer 120. The bottom portion 410e is closer to the substrate 110 than the uppermost surface of at least one insulation layer positioned between the first conductive layer 130 and the fourth conductive layer 170 (e.g., the upper surface of the fifth insulation layer 162).

The ninth insulation layer 410 may not contact the uppermost surface (e.g., the upper surface of the fifth insulation layer 162) of at least one insulation layer positioned between the first conductive layer 130 and the fourth conductive layer 170.

The upper portion 410a, the side portion 410b, the bottom portion 410c, the inclined portion 410d, and the bottom portion 410e of the ninth insulation layer 410 may be connected to each other to form a continuous film. However, depending on embodiments, at least some of the upper portion 410a, the side portion 410b, the bottom portion 410c, the inclined portion 410d, and the bottom portion 410e of the ninth insulation layer 410 may be omitted, and at least two portions may be spaced apart from each other.

The upper portion 410a of the ninth insulation layer 410 is positioned on the upper surface of the fifth conductive layer 172 adjacent to the upper surface of the upper portion 180a of the seventh insulation layer 180, and may further include a portion in contact with the upper surface of the fifth conductive layer 172.

The ninth insulation layer 410 stacked according to the shape of the third opening 185 of the seventh insulation layer 180 corresponding to the anchor structures ANC1 and ANC2 may form a hole 410H that approximately resembles the edge shape of the anchor on the cross-section.

The ninth insulation layer 410 may overlap a part of the edge of the pad PD in the third direction DR3, and does not cover most regions including the central part of the pad PD.

The ninth insulation layer 410 is positioned on the same layer as the ninth insulation layer 410p of the display area DA, and may include the same material and may be formed together in the same process.

The tenth insulation layer 420 may be positioned on the ninth insulation layer 410. The tenth insulation layer 420 is positioned within the third opening 185 of the seventh insulation layer 180. That is, the tenth insulation layer 420 may be positioned in the hole 410H of the ninth insulation layer 410 stacked along the third opening 185. The tenth insulation layer 420 may fill major portions of the hole 410H.

Except the upper surface of the tenth insulation layer 420, most of the tenth insulation layer 420 may contact the ninth insulation layer 410. The tenth insulation layer 420 may include a first portion 420a that is positioned on the upper portion 410a of the ninth insulation layer 410, a second portion 420b that contacts the side surface 410b while disposed next to the side portion 410b of the ninth insulation layer 410, and a third portion 420c that is positioned below, next to, and above the bottom portion 410c, the inclined portion 410d, and the bottom portion 410e of the ninth insulation layer 410, while being in contact with them. The first portion 420a, the second portion 420b, and the third portion 420c of the tenth insulation layer 420 positioned in the hole 410H of the ninth insulation layer 410 may be positioned sequentially from the top and are formed continuously with each other.

A cross-sectional form of the tenth insulation layer 420 positioned within the hole 410H of the ninth insulation layer 410 may be approximately in the form of an anchor as shown in FIG. 6. In the cross-section shown in FIG. 6, the first portion 420a has the largest width at the top in the first direction DR1 and may decrease in width toward the bottom, a width of the second portion 420b may remain substantially constant, and a width of the third portion 420c at the top in the first direction is the largest and decreases toward the bottom similar to the first portion 420a. The width of the second portion 420b may be the same as the width of the bottom of the first portion 420a, and may be smaller than the width of the top of the third portion 420c. The second portion 420b of the tenth insulation layer 420 may be omitted, and in this case, the tip of the protruding portion 180c of the seventh insulation layer 180 may be generally pointed, and thus the side portion 410b of the ninth insulation layer 410 may also be omitted.

The upper surface of the tenth insulation layer 420 may be closer to the substrate 110 than the highest portion from the substrate 110 among the upper portions 410a of the neighboring ninth insulation layer 410, but is not limited thereto.

The tenth insulation layer 420 does not overlap the pad PD in the third direction DR3, and may be spaced apart from the pad PD on a plane.

The tenth insulation layer 420 is positioned on the same layer as the tenth insulation layer 420p of the display area DA, and may include the same material and may be formed together in the same process.

The tenth insulation layer 420 and the ninth insulation layer 410 may be positioned on a twelfth insulation layer 450. The twelfth insulation layer 450 may include a portion that contacts the upper surface of the tenth insulation layer 420 while being positioned thereon, and a portion that contacts the upper portion 410a of the ninth insulation layer 410 while being positioned thereon. The twelfth insulation layer 450 may overlap a part of the edge of the pad PD in the third direction DR3, and the majority of regions including the central part of the pad PD are not covered. The twelfth insulation layer 450 is positioned on the same layer as the twelfth insulation layer 450p of the display area DA, and may include the same material and may be formed together in the same process.

The tenth insulation layer 420, the ninth insulation layer 410, and the twelfth insulation layer 450 may form the anchor structures ANC1 and ANC2 together. In more detail, the anchor structures ANC1 and ANC2 may refer to the tenth insulation layer 420 positioned in the hole 410H by the second opening 142b and portions of the ninth insulation layer 410 and the twelfth insulation layer 450 contacting the tenth insulation layer 420. In addition, the anchor structures ANC1 and ANC2 may include only the tenth insulation layer 420, or may include only the tenth insulation layer 420 and the ninth insulation layer 410.

A sixth conductive layer 460 may be positioned on the twelfth insulation layer 450 and the fifth conductive layer 172. The sixth conductive layer 460 may be patterned and formed in a region corresponding to the pad PD, and may be removed from the regions of the anchor structures ANC1 and ANC2. The sixth conductive layer 460 is positioned on the fifth conductive layer 172 and may be electrically connected to and in contact with the fifth conductive layer 172.

The first conductive layer 130, the fourth conductive layer 170, the fifth conductive layer 172, and the sixth conductive layer 460 stacked sequentially from the bottom and electrically connected to each other may form one pad PD together. Some of the first conductive layer 130, the fourth conductive layer 170, the fifth conductive layer 172, and the sixth conductive layer 460 included in the pad PD may be omitted, and are positioned in a different conductive layer from the corresponding conductive layer of the display area DA described above and may be formed in a different process.

The sixth conductive layer 460 is positioned on the same layer as the second sensing conductive layer of the second sensing electrode 540 and the first sensing electrode 520 of the display area DA, and may include the same material and may be formed together in the same process.

According to the present embodiment, it is possible to prevent defects such as peeling of the seventh insulation layer 180 by the anchor structures ANC1 and ANC2 formed within the second opening 142b of the first insulation layer 140 and at least one insulation layer positioned between the first semiconductor layer 120 and the fourth conductive layer 170, and formed up to the top surface of the first semiconductor layer 120. In particular, as the tenth insulation layer 420 forming the anchor structures ANC1 and ANC2 fills the third opening 185 of the seventh insulation layer 180, the adhesion between a plurality of insulation layers positioned between two adjacent pad PDs can be further improved. The adhesion between the tenth insulation layer 420 and the ninth insulation layer 410 or the twelfth insulation layer 450 is improved by the anchor effect, so that intermolecular attraction and bonding effect is improved at the interface between the tenth insulation layer 420 and the ninth insulation layer 410 or the twelfth insulation layer 450 in contact with it. In addition, although deterioration such as oxidation of the surface of the fifth conductive layer 162 occurs in the etching process of the fourth conductive layer 170 and the fifth conductive layer 172, the upper surface of the fifth insulation layer 162 does not contact the ninth insulation layer 410, and thus the occurrence of defects such as peeling between the fifth insulation layer 162 and the ninth insulation layer 410 is prevented.

A manufacturing method of a display device according to an embodiment will be described with reference to FIGS. 7, 8, 9, 10, 11, 12, and 13, together with the above-described drawings.

FIGS. 7, 8, 9, 10, 11, 12, and 13 are cross-sectional views of a display device in a sequential manufacturing process according to a manufacturing method of a display device according to an embodiment.

Figure 7:
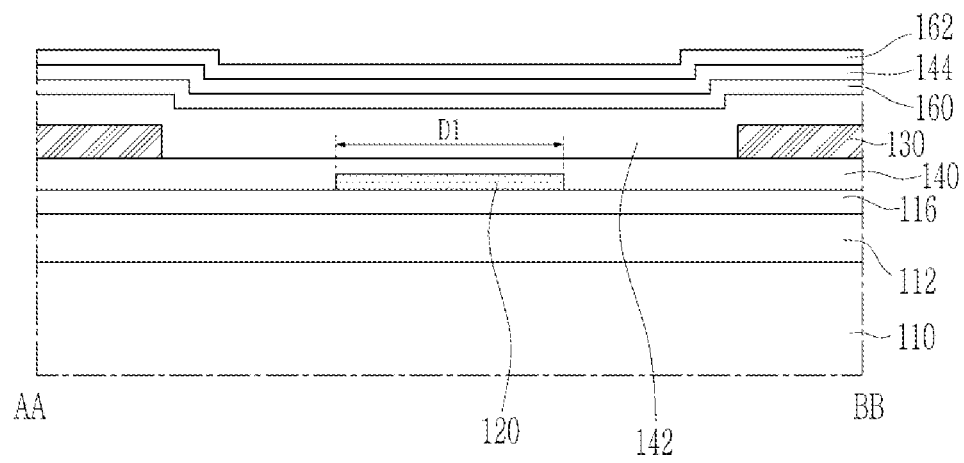
FIGS. 7, 8, 9, 10, 11, 12, and 13 are cross-sectional views of a display device in a sequential manufacturing process according to a manufacturing method of a display device according to an embodiment.
Figure 7:
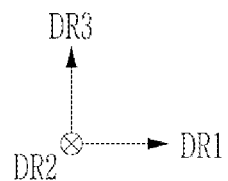

Firstly, referring to FIG. 7, a barrier layer 112 and a buffer layer 116 are stacked on a substrate 110 along the third direction DR3, and then a semiconductor material such as polysilicon is stacked on the barrier layer 112 and the buffer layer 116 and patterned such that a first semiconductor layer 120 is formed. A width D1 of the first semiconductor layer 120 in one direction (e.g., first direction DR1) may be approximately 10 micrometers, but is not limited thereto.

Then, the first insulation layer 140 is stacked on the first semiconductor layer 120, and a conducting material is stacked thereon and patterned to form a first conductive layer 130. The first conductive layer 130 does not overlap the first semiconductor layer 120 and is spaced apart therefrom along the third direction DR3.

Subsequently, at least one insulation layer that may include a second insulation layer 142, a third insulation layer 160, a fourth insulation layer 144, and a fifth insulation layer 162 is stacked on the first conductive layer 130.

Figure 8:
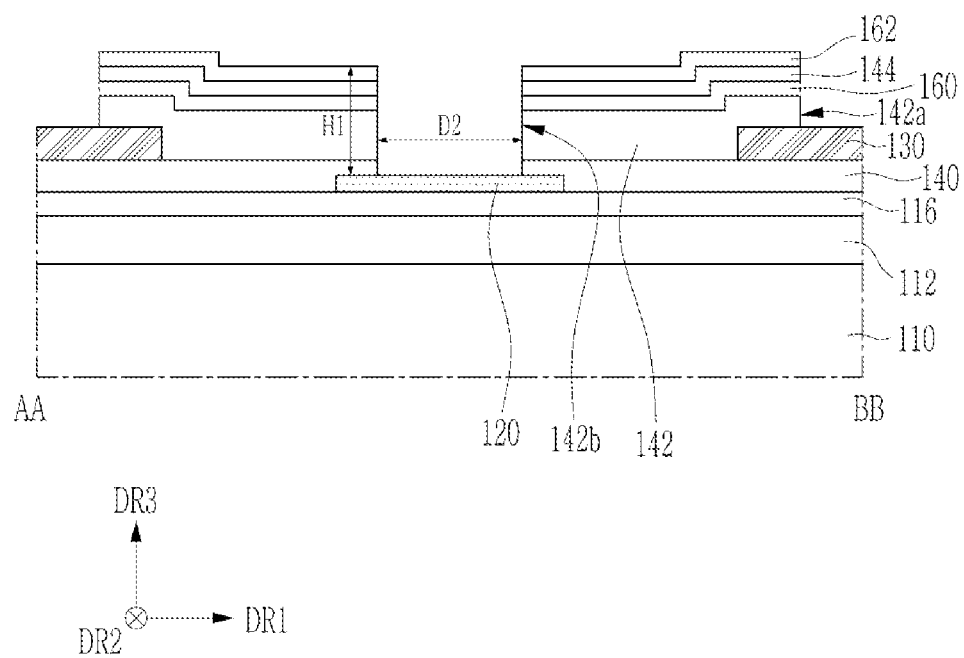

Next, referring to FIG. 8, at least one insulation layer on the first conductive layer 130 is patterned using a photolithography process to form a first opening 142a positioned on the first conductive layer 130 and a second opening 142b positioned on the first semiconductor layer 120. A width D2 the second opening 142b in one direction may be smaller than a width D1 of the first semiconductor layer 120 in the same direction shown in FIG. 7. A depth H1 of the second opening 142b in the third direction DR3 is limited by the first semiconductor layer 120, and thus the second opening 142b may be formed only up to the top surface of the first semiconductor layer 120. That is, the first semiconductor layer 120 serves as an etch stopper when the second opening 142b is formed. The depth H1 of the second opening 142b formed in this way may be approximately 13,000 angstroms to 14,000 angstroms, but is not limited thereto.

Figure 9:
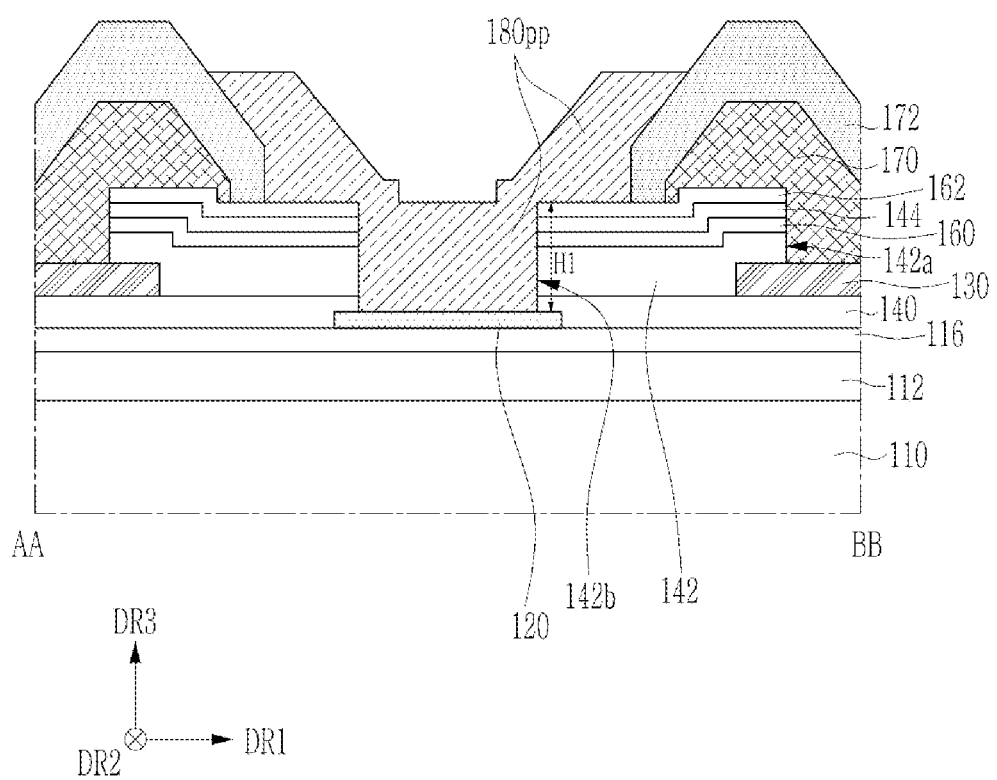

Next, referring to FIG. 9, a conducting material is stacked and patterned on the substrate 110 to form a fourth conductive layer 170, and the conducting material is stacked and patterned thereon to form a fifth conductive layer 172.

Next, an organic insulating material having photosensitivity is laminated on the fifth conductive layer 172, and the like, and an insulation pattern 180pp is formed by patterning with a photo process or the like. The insulation pattern 180pp includes a portion positioned on the uppermost surface of at least one insulation layer on the first conductive layer 130 and a portion positioned within the second opening 142b. The insulation pattern 180pp does not overlap the majority of a planar central portion of the fifth conductive layer 172 and is exposed, but may cover a side surface of the fifth conductive layer 172.

In the photo process for the formation of the insulation pattern 180pp, it is possible to form the insulation pattern 180pp with a smaller thickness than a thickness of the seventh insulation layer 180 positioned in a different portion on the substrate 110 by using a halftone mask. A thickness of the insulation pattern 180pp positioned within the second opening 142b in the third direction DR3 may be equal to or slightly larger than the depth H1 of the second opening 142b.

Figure 10:
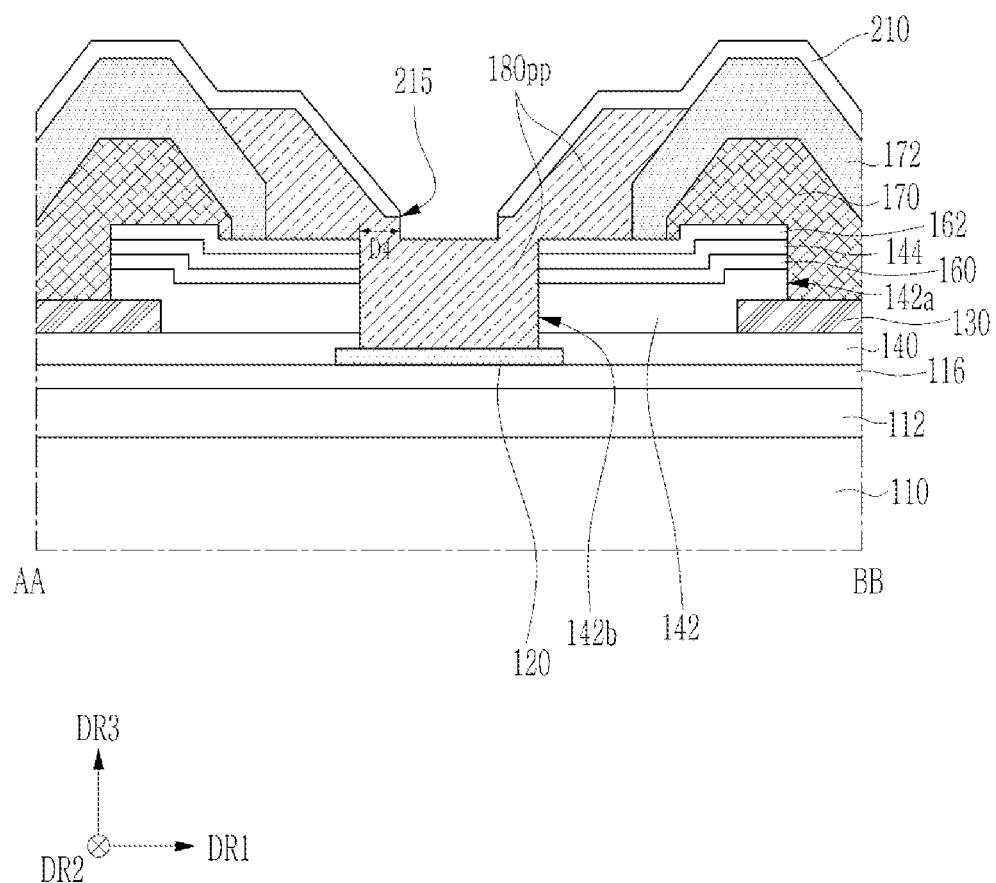

Next, referring to FIG. 10, the conducting material is laminated and patterned on the substrate 110 to form a protection pattern 210, and an opening 215 corresponding to the second opening 142b is formed in the protection pattern 210. A distance D4 between an edge of the opening 215 of the protection pattern 210 and an edge of the second opening 142b on a plane is greater than 0 and may be, for example, approximately 1 micrometer, but is not limited thereto.

The protection pattern 210 is positioned on the same layer as the pixel electrode 210p of the display area DA, and may include the same material and may be formed together in the same process.

Figure 11:
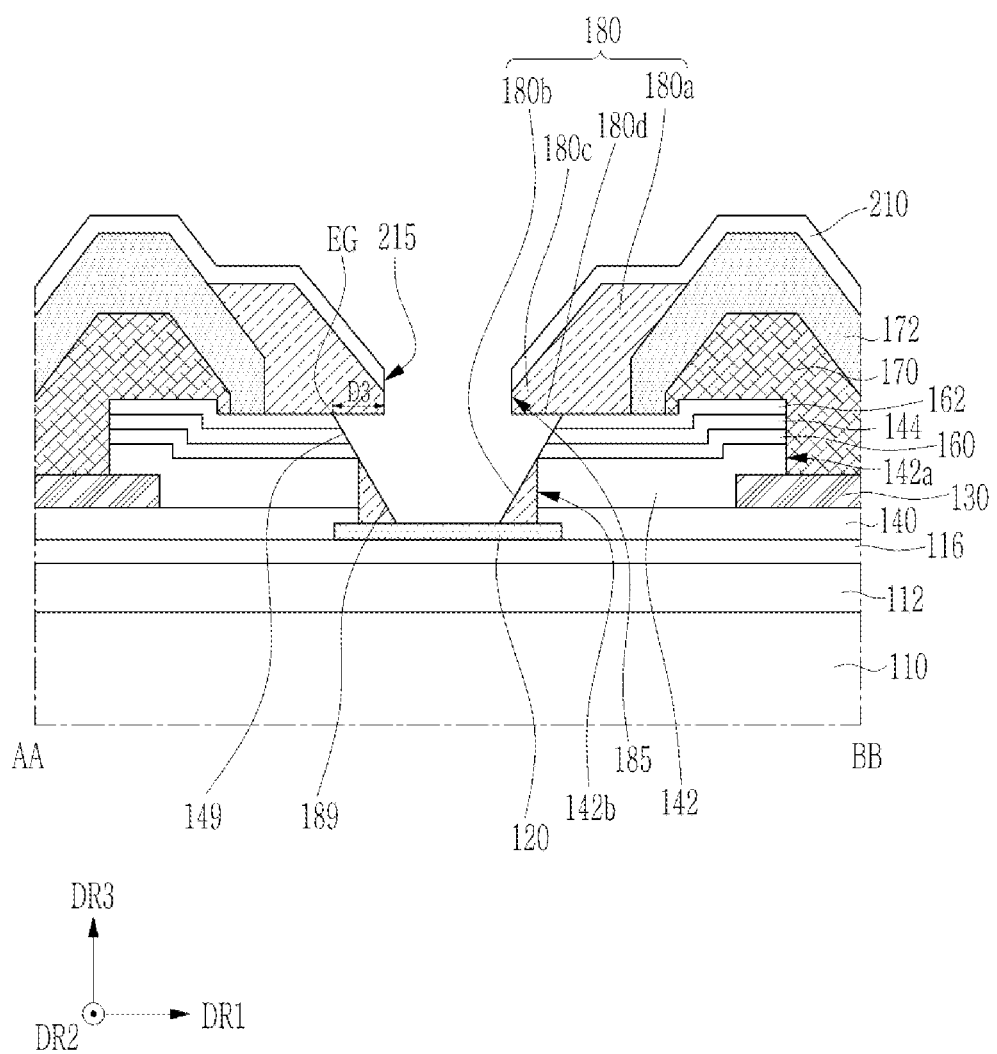

Next, referring to FIG. 11, the insulation pattern 180pp of FIG. 10 is etched by using the protection pattern 210 as an etching mask to form a seventh insulation layer 180. In this case, a dry etching process may be used. A portion of the insulation pattern 180pp, covered with the protection pattern 210, is hardly etched, and the majority portion of the insulation pattern 180pp positioned between the second opening 142b may be etched. Etching may proceed until inclined surfaces 149 and 189 as described above are formed on the side of the first insulation layer 140 forming the second opening 142b and at least one insulation layer positioned thereon. A length D3 of a bottom surface 180d a protruding portion 180c of the seventh insulation layer 180, protruded from an end portion EG of an upper surface of the fifth insulation layer 162, may be greater than 0, for example, greater than approximately 1 micrometer to 2 micrometers, but is not limited thereto.

Figure 12:
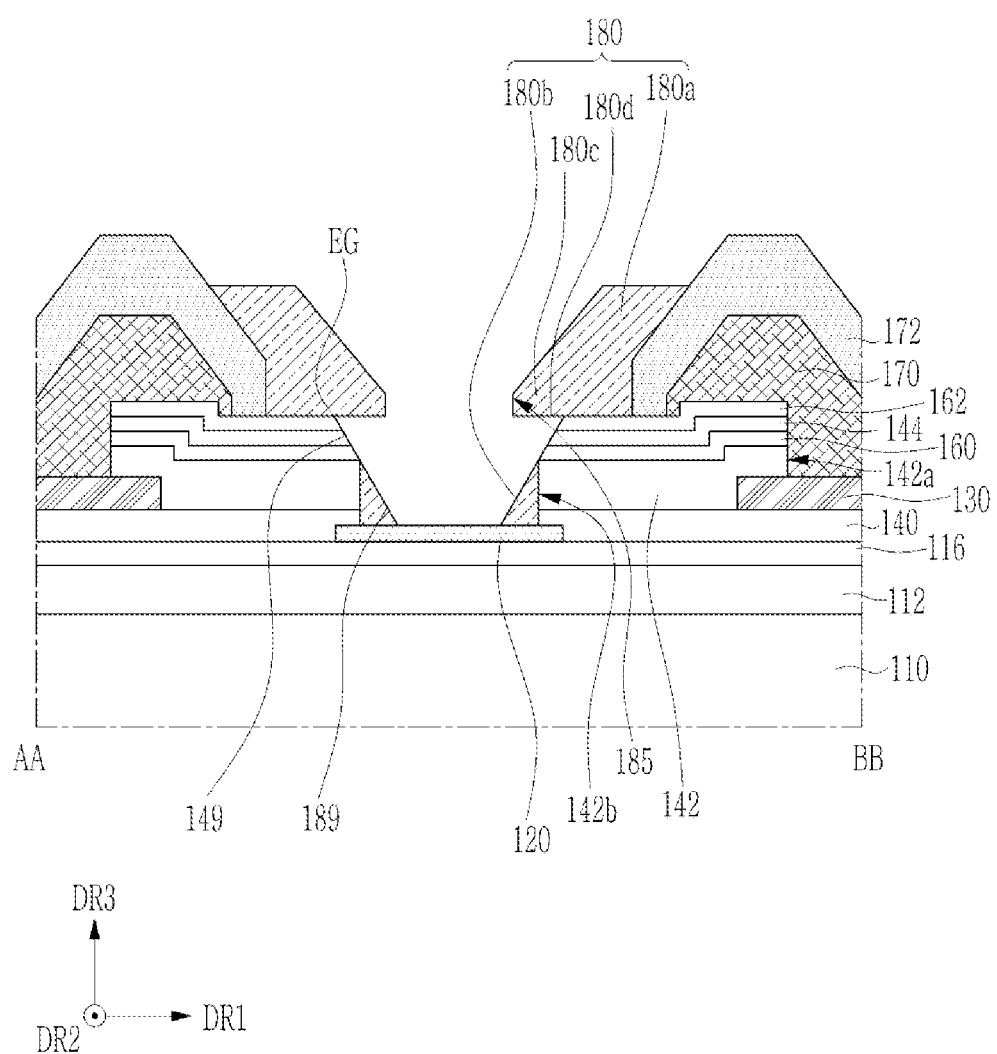

Referring to FIG. 12, the protection pattern 210 illustrated in FIG. 11 is removed. A cross-sectional shape of a third opening 185 of the seventh insulation layer 180 may have the shape of an anchor as described above.

Figure 13:
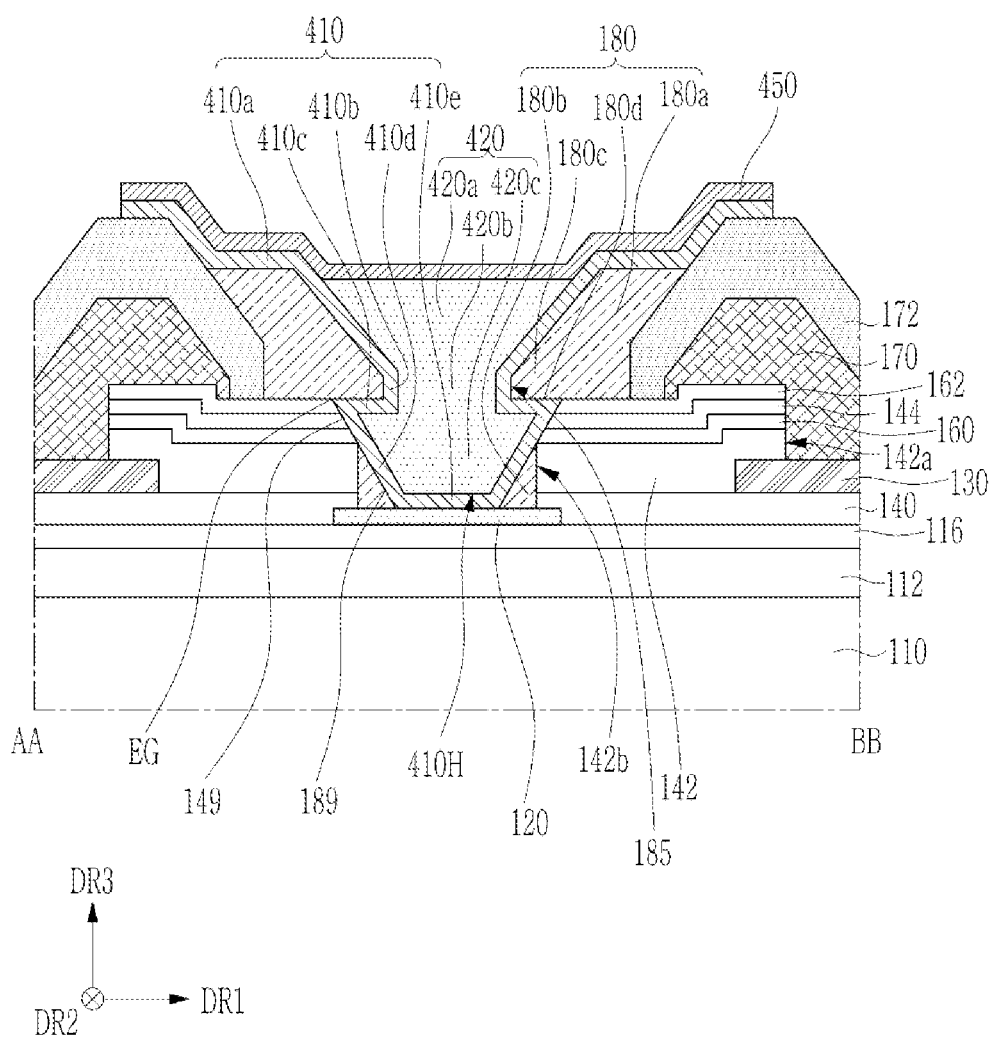

Next, referring to FIG. 13, a ninth insulation layer 410 is formed by laminating an insulating material on the exposed surface of the seventh insulation layer 180 and the surface of the fifth conductive layer 172. Subsequently, a tenth insulation layer 420 is formed in a hole 410H of the ninth insulation layer 410. Next, an insulating material is laminated on the substrate 110 and patterned to form a twelfth insulation layer 450.

Referring back to FIG. 6, the conducting material is laminated on the substrate 110 and patterned to form the sixth conductive layer 460. Accordingly, the anchor structures ANC1 and ANC2 positioned between the pad PD and the neighboring pad PD can be completed.

Next, display devices according to embodiments will be described respectively reference to FIGS. 14, 15, 16, and 17.

FIGS. 14, 15, 16, and 17 are cross-sectional views of pad areas of display devices according to embodiments.

Figure 14:
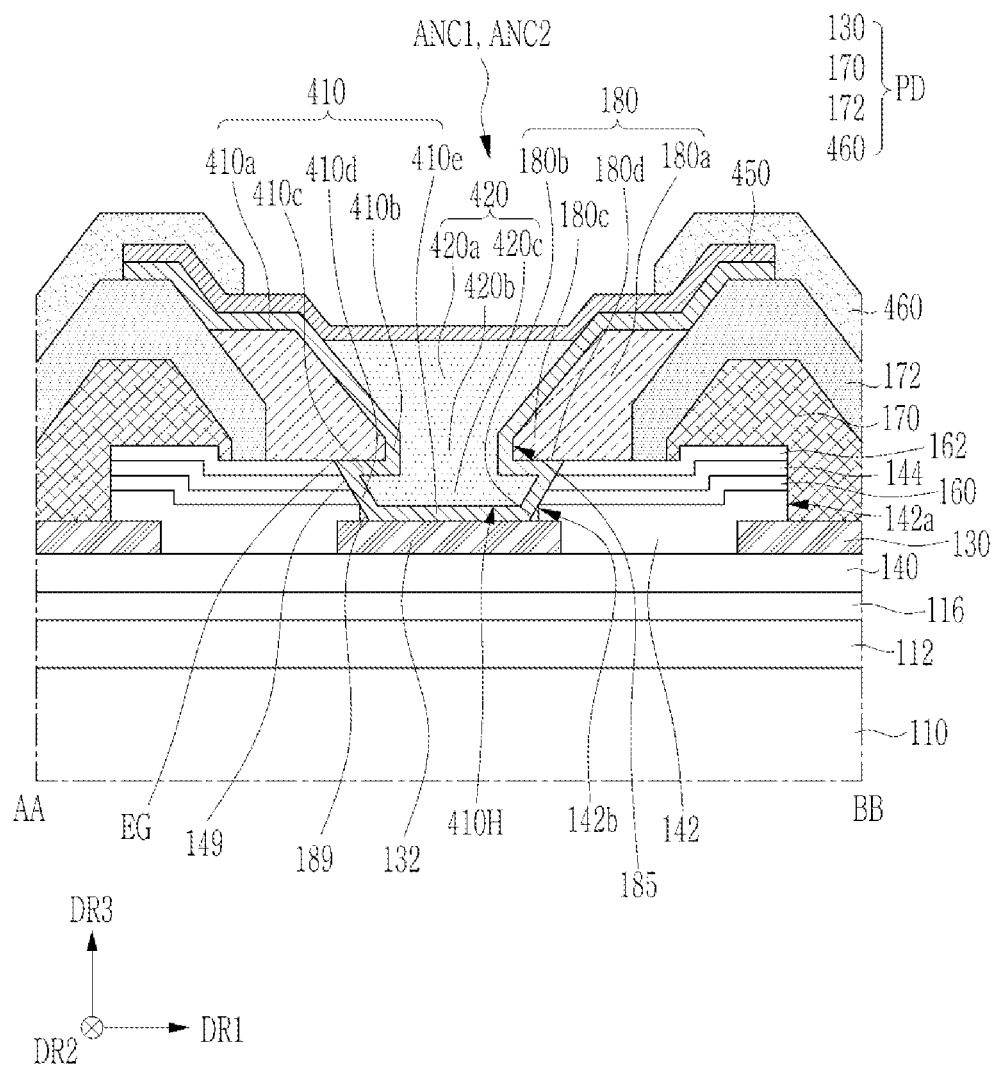
FIGS. 14, 15, 16 and 17 are cross-sectional views of pad areas of display devices according to embodiments.

First, referring to FIG. 14, a display device according to the present embodiment is almost the same as the above-described display device, except that when the second opening 142b is formed, the first semiconductor layer 120 serving as an etch stopper is omitted, and a first conductive pattern 132 may be positioned instead. The first conductive pattern 132 may be patterned and formed in regions corresponding to anchor structures ANC1 and ANC2. The first conductive pattern 132 may be positioned on a first insulation layer 140. The first conductive pattern 132 is positioned on the same layer as the first conductive layer 130, and may include the same material and may be formed together in the same process.

According to the present embodiment, the second opening 142b of at least one insulation layer which may include the second insulation layer 142, the third insulation layer 160, the fourth insulation layer 144, and the fifth insulation layer 162 positioned between the first conductive layer 130, the first conductive pattern 132, and the fourth conductive layer 170 may be formed up to an upper surface of the first conductive pattern 132. Therefore, the anchor structures ANC1 and ANC2 including the third opening 185 of the seventh insulation layer 180, the hole 410H of the ninth insulation layer 410, or an anchor structure of the tenth insulation layer 420 may be formed on the top of the first conductive pattern 132. In this case, a depth in the third direction DR3 of the second opening 142b on the first conductive pattern 132 is smaller than the depth H1 of the second opening 142b described above with reference to FIG. 9, for example, it may be approximately 11,000 angstroms to 12,000 angstroms, but is not limited thereto.

Figure 15:
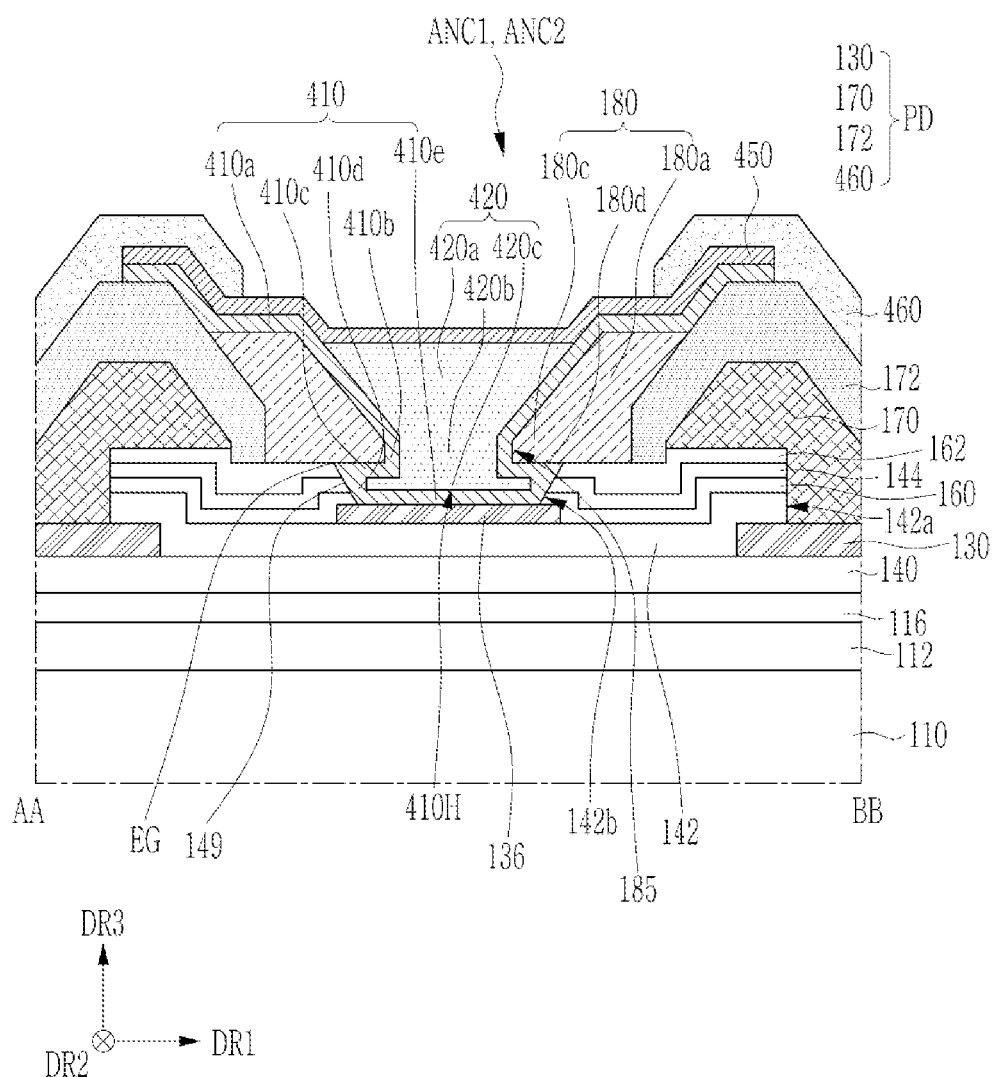

Next, referring to FIG. 15, a display device according to the present embodiment is almost the same as the above-described display device, except that when the second opening 142b is formed, the first semiconductor layer 120 or the first conductive pattern 132 serving as an etch stopper is omitted, and a second conductive layer 136 may be positioned instead. The second conductive layer 136 may be patterned and formed in regions corresponding to anchor structures ANC1 and ANC2. The second conductive layer 136 may be positioned over a second insulation layer 142. The second conductive layer 136 may be positioned on the same layer as the second conductive layer 136p of the display area DA, and may include the same material and may be formed together in the same process. The second conductive layer 136 is also called a pattern.

According to the present embodiment, the second opening 142b of at least one insulation layer that may include a third insulation layer 160, a fourth insulation layer 144, and a fifth insulation layer 162 positioned on a higher layer than the second conductive layer 136 may be formed up to the top of the second conductive layer 136. Therefore, the anchor structures ANC1 and ANC2 including the third opening 185 of the seventh insulation layer 180, the hole 410H of the ninth insulation layer 410, or an anchor structure of the tenth insulation layer 420 may be formed on the top of the second conductive layer 136. In this case, a depth of the second opening 142b on the second conductive layer 136 in a third direction DR3 may be smaller than the depth of the second opening 142b shown in FIG. 6 or FIG. 14, and may be, for example, approximately 10,000 angstroms to 11,000 angstroms, but is not limited thereto.

In the present embodiment, the lower portion 180b and the inclined surface 189 of the seventh insulation layer 180 shown in the preceding embodiment may be omitted.

Figure 16:
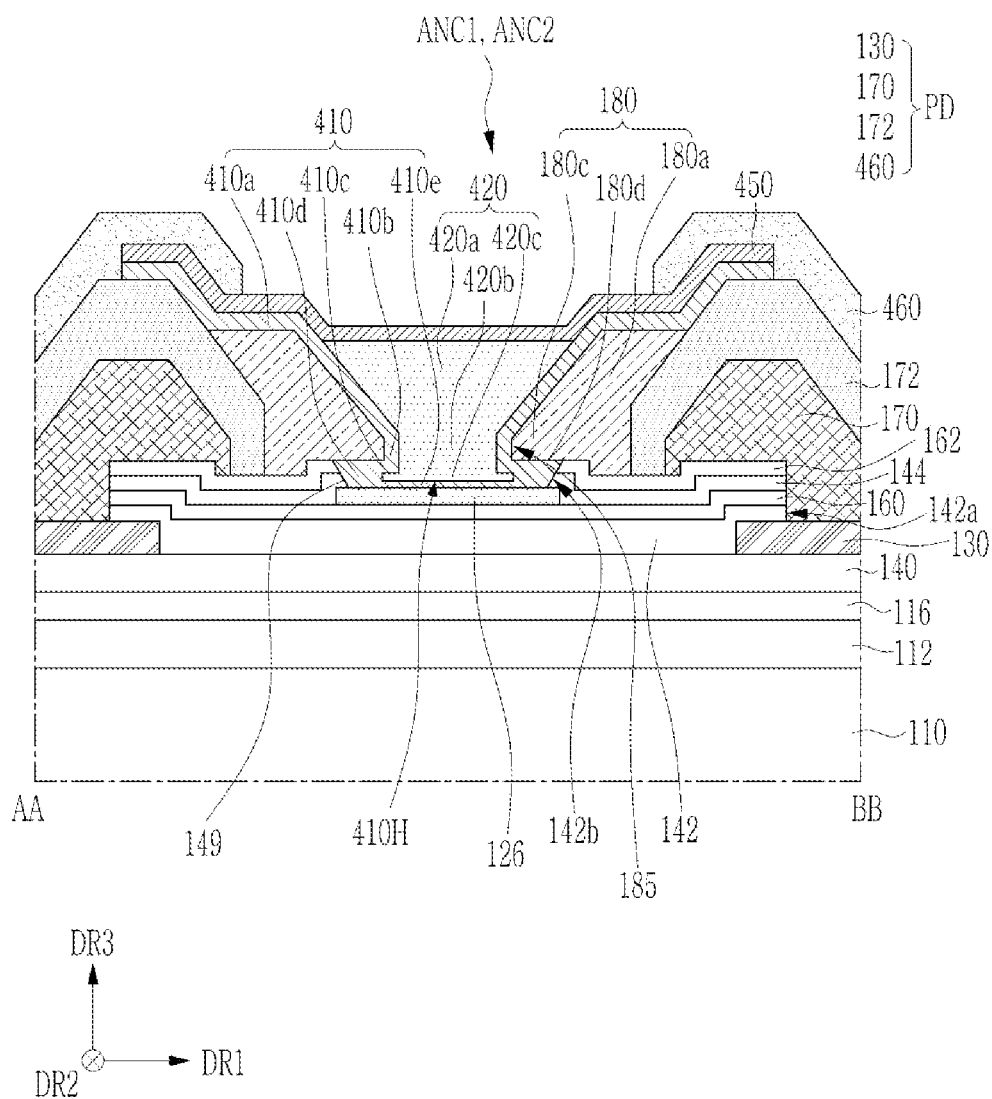

Next, referring to FIG. 16, the display device according to the present embodiment is mostly the same as the display device described above, except that the first semiconductor layer 120, the first conductive pattern 132, or the second conductive layer 136, which serves as an etch stopper when forming the second opening 142b, are omitted, and the second semiconductor layer 126 may be positioned instead. The second semiconductor layer 126 may be patterned and formed in regions corresponding to the anchor structures ANC1 and ANC2. The second semiconductor layer 126 may be positioned on the third insulation layer 160. The second semiconductor layer 126 is positioned on the same layer as the second semiconductor layer 126p of the display area DA, and may include the same material and may be formed together in the same process. The second semiconductor layer 126 is also called a pattern.

According to the present embodiment, the second opening 142b of at least one insulation layer, which may include a fourth insulation layer 144 and a fifth insulation layer 162 positioned above the second semiconductor layer 126, may be formed up to the upper surface of the second semiconductor layer 126. Therefore, the third opening 185 of the seventh insulation layer 180, the hole 410H of the ninth insulation layer 410, or an anchor structure of the tenth insulation layer 420 in the anchor structures ANC1 and ANC2 may be formed on the second semiconductor layer 126. In this case, a depth of the second opening 142b on the second conductive layer 136 in the third direction DR3 may be smaller than the depth of the second opening 142b shown in FIG. 6, FIG. 14, or FIG. 15, and may be, for example, approximately 6000 angstroms to 7000 angstroms, but is not limited thereto.

In the present embodiment, the lower portion 180b and the inclined surface 189 of the seventh insulation layer 180 shown in the above-described embodiment may be omitted.

Figure 17:
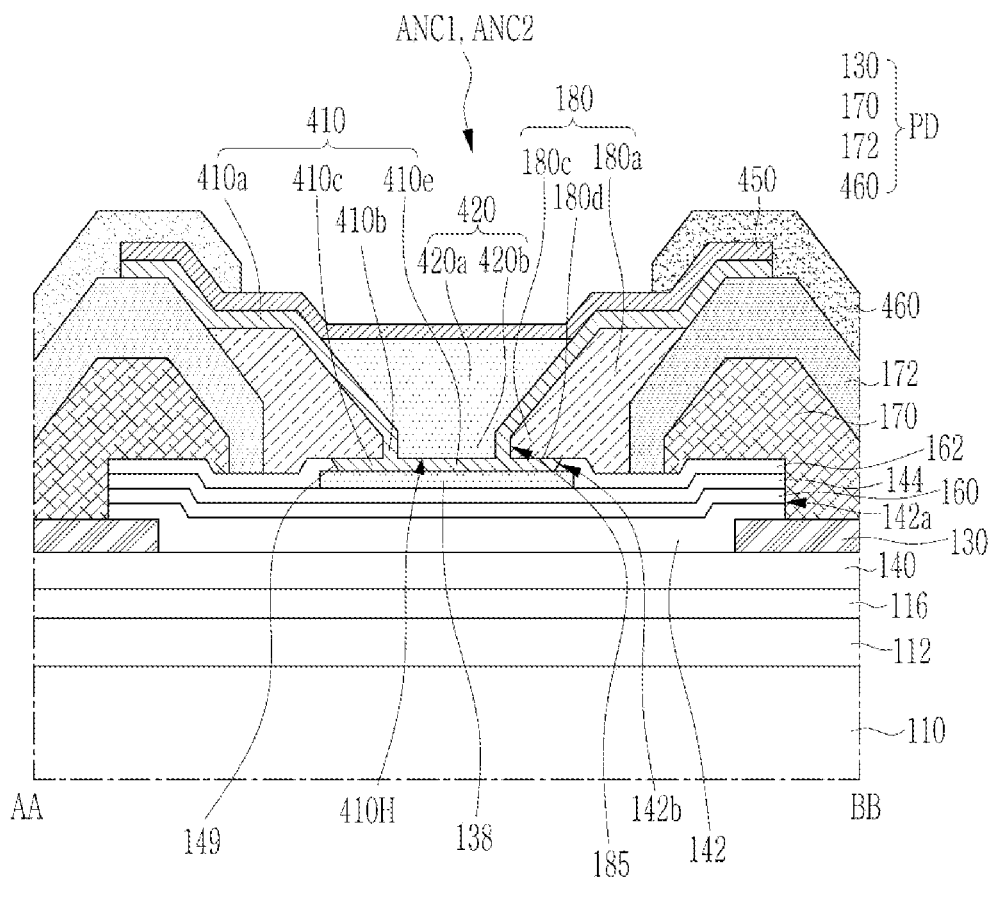

Next, referring to FIG. 17, a display device according to the present embodiment is mostly the same as the display device described above, except that the first semiconductor layer 120, the first conductive pattern 132, the second conductive layer 136, or the second semiconductor layer 126, which serve as an etch stopper when the second opening 142b is formed, are omitted and the third conductive layer 138 can be positioned instead. The third conductive layer 138 may be patterned and formed in regions corresponding to anchor structures ANC1 and ANC2. The third conductive layer 138 may be positioned over the fourth insulation layer 144. The third conductive layer 138 is positioned on the same layer as a third conductive layer 138p of the display area DA, and may include the same material and may be formed together in the same process. The third conductive layer 138 is also called a pattern.

According to the present embodiment, the second opening 142b of at least one insulation layer, which may include a fifth insulation layer 162 positioned on a higher layer than the third conductive layer 138, may be formed up to the upper surface of the third conductive layer 138. Therefore, the third opening 185 of the seventh insulation layer 180, the hole 410H of a ninth insulation layer 410, or anchor structures ANC1 and ANC2 including the form of an anchor of the tenth insulation layer 420 may be formed on the upper portion of the third conductive layer 138. In this case, a depth of the second opening 142b on the second conductive layer 136 in the third direction DR3 may be smaller than the depth of the second opening 142b shown in FIG. 6, FIG. 14, FIG. 15, or FIG. 16, and may be, for example, approximately 4000 angstroms to 6000 angstroms, but is not limited thereto.

In the present embodiment, the lower portion 180b and the inclined surface 189 of the seventh insulation layer 180, and the inclined portion 410d of the ninth insulation layer 410 illustrated in the above-described embodiment, may be omitted.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A display device comprising a display area including a plurality of pixels and a pad area disposed outside the display area,
   wherein the pad area includes a plurality of pads, and an anchor structure positioned between two adjacent pads among the plurality of pads,
   the pad area further includes a substrate and at least one insulation layer that is positioned on the substrate and a first opening positioned between the two adjacent pads that is formed in the at least one insulation layer when viewed in a cross-section,
   the anchor structure includes a first insulation layer that is positioned in the first opening and that does not overlap the two adjacent pads, and
   the first insulation layer includes a first portion of which a width gradually decreases coming closer to the substrate.

2. The display device of claim 1, further comprising a pattern positioned between the anchor structure and the substrate that does not overlap the two adjacent pads.

3. The display device of claim 2, wherein
the first opening is formed up to a top of the pattern, and
a width of the first opening is smaller than a width of the pattern.

4. The display device of claim 3, wherein
the pattern includes a semiconductor layer positioned between the at least one insulation layer and the substrate.

5. The display device of claim 3, wherein
the pattern includes a conductive layer positioned between the at least one insulation layer and the substrate.

6. The display device of claim 2, further comprising
a second insulation layer that is positioned between the at least one insulation layer and the first insulation layer,
wherein a surface of the first insulation layer except an upper surface is in contact with the second insulation layer.

7. The display device of claim 6, wherein
the second insulation layer forms a hole corresponding to the first opening, and
the first insulation layer is positioned in the hole.

8. The display device of claim 7, wherein
the second insulation layer further includes a portion overlapping the pad.

9. The display device of claim 7, wherein
the second insulation layer further includes a portion contacting the pattern.

10. A display device comprising a display area including a plurality of pixels and a pad area disposed outside the display area,
wherein the pad area includes a plurality of pads, and an anchor structure positioned between two adjacent pads among the plurality of pads,
the pad area further includes a substrate and at least one insulation layer that is positioned on the substrate and a first opening positioned between the two adjacent pads that is formed in the at least one insulation layer when viewed in a cross-section,
the anchor structure includes a first insulation layer that is positioned in the first opening and that does not overlap the two adjacent pads,
the pad area further includes a pattern positioned between the anchor structure and the substrate that does not overlap the two adjacent pads,
the pad area further includes a second insulation layer that is positioned between the at least one insulation layer and the first insulation layer,
a surface of the first insulation layer except an upper surface is in contact with the second insulation layer,
the pad area further includes a third insulation layer that is positioned between the at least one insulation layer and the second insulation layer, and
the third insulation layer includes an upper portion that contacts a side surface of a first conductive layer included in the two adjacent pads.

11. The display device of claim 10, wherein
the upper portion of the third insulation layer includes a protrusion portion that protrudes toward the inside of the first opening from an end of the uppermost surface of the at least one insulation layer.

12. The display device of claim 11, wherein
at least a portion of the side surface of the at least one insulation layer forms an inclined surface with respect to a top surface of the substrate in the first opening.

13. The display device of claim 10, wherein
the pad further includes a second conductive layer overlapping the first conductive layer, and
the at least one insulation layer further includes a second opening positioned on the second conductive layer.

14. The display device of claim 1, wherein
the first insulation layer further includes a second portion that is positioned on the first portion and of which a width gradually becomes smaller coming closer to the substrate.

15. A display device comprising:
a substrate;
a plurality of pads including a first conductive layer positioned on the substrate;
a plurality of insulation layers that are positioned between the substrate and the first conductive layer; and
an anchor structure that is positioned between two adjacent pads among the plurality of pads,
wherein a first opening that is positioned between the two adjacent pads is formed in the plurality of insulation layers,
the anchor structure includes a first insulation layer positioned in the first opening, and
a width of the first insulation layer decreases coming closer to the substrate.

16. The display device of claim 15, further comprising a pattern positioned between the anchor structure and the substrate that does not overlap the two adjacent pads.

17. A manufacturing method of a display device, comprising steps of:
forming a pattern on a substrate, the pattern having a first width;
forming a plurality of insulation layers overlapping the pattern, a first opening of the plurality of insulation layers having a second width that is smaller than the first width;
forming a first conductive layer of a pad on the plurality of insulation layers;
forming an insulation pattern that includes a portion positioned in the first opening and covers a side surface of the first conductive layer;
forming a protection pattern on the insulation pattern, the protective pattern having a second opening corresponding to the first opening;
forming a first insulation layer having a third opening corresponding to the first opening by etching the insulation pattern using the protection pattern as an etching mask; and
forming a second insulation layer positioned in the third opening,
wherein the second insulation layer does not overlap the pad, and
a width of the first insulation layer decreases coming closer to the substrate.

18. The manufacturing method of the display device of claim 17, wherein
the first insulation layer includes a protrusion portion protruded inward of the first opening from an end portion of an uppermost surface of the plurality of insulation layers.

* * * * *